(12) United States Patent
Li et al.

(10) Patent No.: US 8,339,158 B2
(45) Date of Patent: Dec. 25, 2012

(54) HIGH SPEED DYNAMIC COMPARATIVE LATCH

(75) Inventors: Bin Li, Chengdu (CN); Guosheng Wu, Chengdu (CN)

(73) Assignee: IPGoal Microelectronics (SiChuan) Co., Ltd., Chengdu, Sichuan Province (CN)

( * ) Notice: Subject to any disclaimer, the term of this patent is extended or adjusted under 35 U.S.C. 154(b) by 113 days.

(21) Appl. No.: 12/981,514

(22) Filed: Dec. 30, 2010

(65) Prior Publication Data

US 2012/0133395 A1    May 31, 2012

(51) Int. Cl.
*G01R 19/00* (2006.01)
*H03F 3/45* (2006.01)
(52) U.S. Cl. .................. 327/57; 327/52; 327/55; 327/65
(58) Field of Classification Search ...................... 327/52, 327/54, 55, 57, 63–65, 214, 215, 223, 67, 327/91, 94–97, 199, 200, 208, 210–212
See application file for complete search history.

(56) References Cited

U.S. PATENT DOCUMENTS

| | | | | |
|---|---|---|---|---|
| 7,372,307 | B1 * | 5/2008 | Wu | 327/96 |
| 7,405,691 | B2 * | 7/2008 | Makigawa et al. | 341/159 |
| 7,679,406 | B2 * | 3/2010 | Yagi | 327/57 |
| 2005/0242845 | A1 * | 11/2005 | Wu | 327/78 |
| 2010/0315149 | A1 * | 12/2010 | Wu et al. | 327/307 |

* cited by examiner

*Primary Examiner* — Patrick O'Neill

(57) ABSTRACT

A dynamic high-speed comparative latch comprises a pre-amplifier unit for enlarging input differential signals, a regenerating latch unit for latching outputted differential signals from the pre-amplifier unit by using a positive feedback, specifically, converting the output of the pre-amplifier unit into a latched result at a first state of a clock cycle, and then retaining the latched result and simultaneously resetting relevant nodes at a second state opposite to the first state of the clock cycle, and a latch unit for outputting the effective outputted value of the regenerating latch unit when the regenerating latch unit being in a retaining state. The pre-amplifier unit is connected with the regenerating latch unit, and the regenerating latch unit is connected with the latch unit. The pre-amplifier unit comprises only one input clock signal. The present invention has a simple structure, and ensures the correctness of the output result of the latch.

4 Claims, 9 Drawing Sheets

(the enlarged break down views follow)

Fig.2 (the enlarged break down views follow) (Prior Art)

Fig.6 (the enlarged break down views follow)

HIGH SPEED DYNAMIC COMPARATIVE LATCH

BACKGROUND

1. Field of Invention

The present invention is related to a comparative latch, specifically, to a high-speed and low-offset dynamic comparative latch with less likely occurrence of mistuning.

2. Description of Related Arts

The high-speed dynamic comparative latch has the characteristics of high speed, low power consumption, high input impedance and full-swing output, and thus is applied widespreadly to the high-speed analog-to-digital converters, sense amplifiers and data receivers. The comparative latch is consisting of three parts, as shown in FIG. 1. One is the preamplifier unit, which enlarges the differential mode of input signals and outputs to the next part, regenerative latch; the second is the regenerative latch unit connected with the preamplifier unit, which uses a positive feedback to latch the differential mode signals; then the final part, a DFF unit (digital flip-flop) connected with the regenerative latch unit, which converts the latched differential mode signals to full-swing and outputs them out.

FIG. 2 is a circuit diagram of the current high-speed dynamic comparative latch.

Referring to FIG. 2, INP/INN is a pair of differential input signals; CLKP/CLKN is a pair of differential input clocks; OUT is the output of the high speed dynamic comparative latch.

The pre-amplifier unit A is consisting of a pair of input FET (Field Effect Transistor) M1 and M2, a pair of clock-controlled reset FET M4 and M5, and a clock-controlled FET transistor M3.

The regenerating latch unit is consisting of a pair of input-controlled FET M7 and M8, latching FET M11/M12/M13/M14, and a clock-controlled FET M0.

The DFF unit is consisting of two latches. One DFF unit is a high level latch unit that is consisting of a switch FET (Filed Effect Transistor) M6 controlled by the input clock CLKP, an inverter consisting of FET M18 and M19, and the other inverter consisting of FET M20 and M19, wherein the switch FET and the two inverters are connected with each other end to end; the other DFF unit is a low level latch unit that is consisting of a switch FET M21 controlled by clock CLKN, an inverter consisting of FET M10 and M16, and the other inverter consisting of FET M9 and M15, wherein they are connected with each other end to end.

When the clock CLKP changes from a low level to a high level, the clock CLKN changes from a high level to a low level, namely, CLKP is rising and CLKN is falling, the high-speed comparator changes from a reset mode to a working mode. The pair of reset FET M5/M4 of the pre-amplifier controlled by CLKP is turned off; the clock CLKP controls M3 to be turned on. The clock-controlled FET M0 of the regenerating latch controlled by the clock CLKN is turned on; the regenerating latch gets into a positive feedback latching mode form a reset mode. The nodes PB1/NB1 still stay in a low state (PB1=0/NB1=0). M6 of the DFF controlled by the clock CLKP is turned on, so the high-level latch gets into a latching state; M21 controlled by the clock CLKN is turned off, so the low-level latch gets into a holding state, and then the output OUT keeps the same.

When the clock CLKP is in a high level, the high speed comparator is in the latching mode. The differential mode of the input differential signals, after being enlarged by the pre-amplifier through node PA1, controls FET M7 of the regenerating latch and controls transistor M8 through node NA1; the regenerating latch reestablishes signals through M7 and M8, which inject currents proportionate to the differential mode of the input signals, and finally latches the inputted differential mode to a corresponding status. Once the reestablishment is done, even if the differential signals INP/INN change, the output of the regenerating latch will not change along with it. The clock CLKP controls the FET M6 of the latch to be turned on; that way, the high level latch gets into the latching status, and NC1 is latched as the output of the current regenerating latch; The clock CLKN controls M21 to be turned off, and the low level regenerating latch gets into a retaining status and the output OUT will keep the immediate previous status.

When the clock CLKP changes from the high level to the low level, and retains the low level, the high-speed comparator changes its working mode to a reset mode. In the pre-amplifier, the pair of reset FET M4/M5 is turned on and the FET M3 is turned off through the control of the clock CLKP; thus, the output of PA1/NA1 is pulled up to the power supply (PA1=1/NA1=1). In the regenerating latch, the clock CLKN controls the FET M0 to be turned off. Because PA1 and NA1 are pulled up to the power supply, the FET M7 is turned on through the control of PA1, and the node NB1 is pulled down to the ground; the FET M8 is turned on through the control of NA1, then the node PB1 is pulled down to the ground. In the latch, the FET M6 is turned off by the clock CLKP, so the high level latch gets into a retaining status, and NC1 is kept as the output of the immediate previous working mode of the regenerating latch. The clock CLKN controls M21 to be turned on, so the low level latch gets into the latching status, and so the output OUT is that one of the immediate previous working mode of the regenerating latch.

The existing high-speed dynamic comparative latch has the following shortcomings:
1) The circuit characteristics of the regenerating latch unit B make it necessary to use a pair of differential clocks, and the timing sequence of the two differential clocks need to match precisely with each other. As the clock rate of high speed systems is increasing, the requirement of precise matching of the differential clocks challenges the design and the implementation of the physical layer;
2) The circuit characteristics of the regenerating latch unit B determine that during the high level of a clock cycle it is in a working status, and during the low level it is in a reset status; namely, the output of the regenerating latch unit B is effective only during the period of the high level of the clock cycle, and the output during the period of the low level of the clock cycle is ineffective;
3) The regenerating latch circuit B needs a certain time to achieve latching, when it switches from a resetting status to a latching and outputting status; but the time depends on the transistors and parasitic parameters of the circuit; therefore it gets rise to an uncertain delay time of the output of the regenerating latch unit B under different technology and temperatures, relative to the rising edge of the clock, and accordingly compresses the effective values of the latch; if applied to take samples of a high speed clock, it will cause the erroneous output of the latch.

SUMMARY OF THE PRESENT INVENTION

The object of the present invention is to furnish a high-speed comparative latch in order to overcome the shortcomings of the current technology, which needs only one clock, the outputted data of the regenerating latch unit can stay effective in a whole clock cycle, and avoids the occurrence of erroneous output of the latch.

According to the invention, the dynamic high-speed comparative latch comprises a pre-amplifier unit for enlarging input differential signals, a regenerating latch unit for latching outputted differential signals from the pre-amplifier unit by using a positive feedback, specifically, converting the output of the pre-amplifier unit into a latched result at a first state of a clock cycle, and then retaining the latched result and simultaneously resetting relevant nodes at a second state opposite to the first state of the clock cycle, and a latch unit for outputting the effective outputted value of the regenerating latch unit when the regenerating latch unit being in a retaining state. The pre-amplifier unit is connected with the regenerating latch unit, and the regenerating latch unit is connected with the latch unit. The pre-amplifier unit comprises only one input clock signal.

The present invention has the following advantages:
1) With the new circuit design of the regenerating latch unit, the present invention needs only one clock signal, compared with the prior art which needs a pair of differential clocks;
2) In a clock cycle, not only during the high level the regenerating latch unit latches the outputted signals of the pre-amplifier nit, but also during the low level it still can keep the effective latched state; in other words, the outputted data of the regenerating latch unit are always effective in a clock cycle.
3) It has been solved that the different establishing time of the latch of the regenerating latch unit and different outputted parasitical parameters due to the different technology and temperatures lead to the uncertainty of the delay time of its output relative to the rising edge of the clock, and accordingly compress the effective latched values, and finally give rise to the erroneous output of the latch circuit.

These and other objectives, features, and advantages of the present invention will become apparent from the following detailed description, the accompanying drawings and the appended claims.

DETAILED DESCRIPTION OF THE PREFERRED EMBODIMENTS

Figure 1:
FIG. 1 is a schematic structural block diagram of a high-speed dynamic comparative latch of the current technology.
Figure 2:
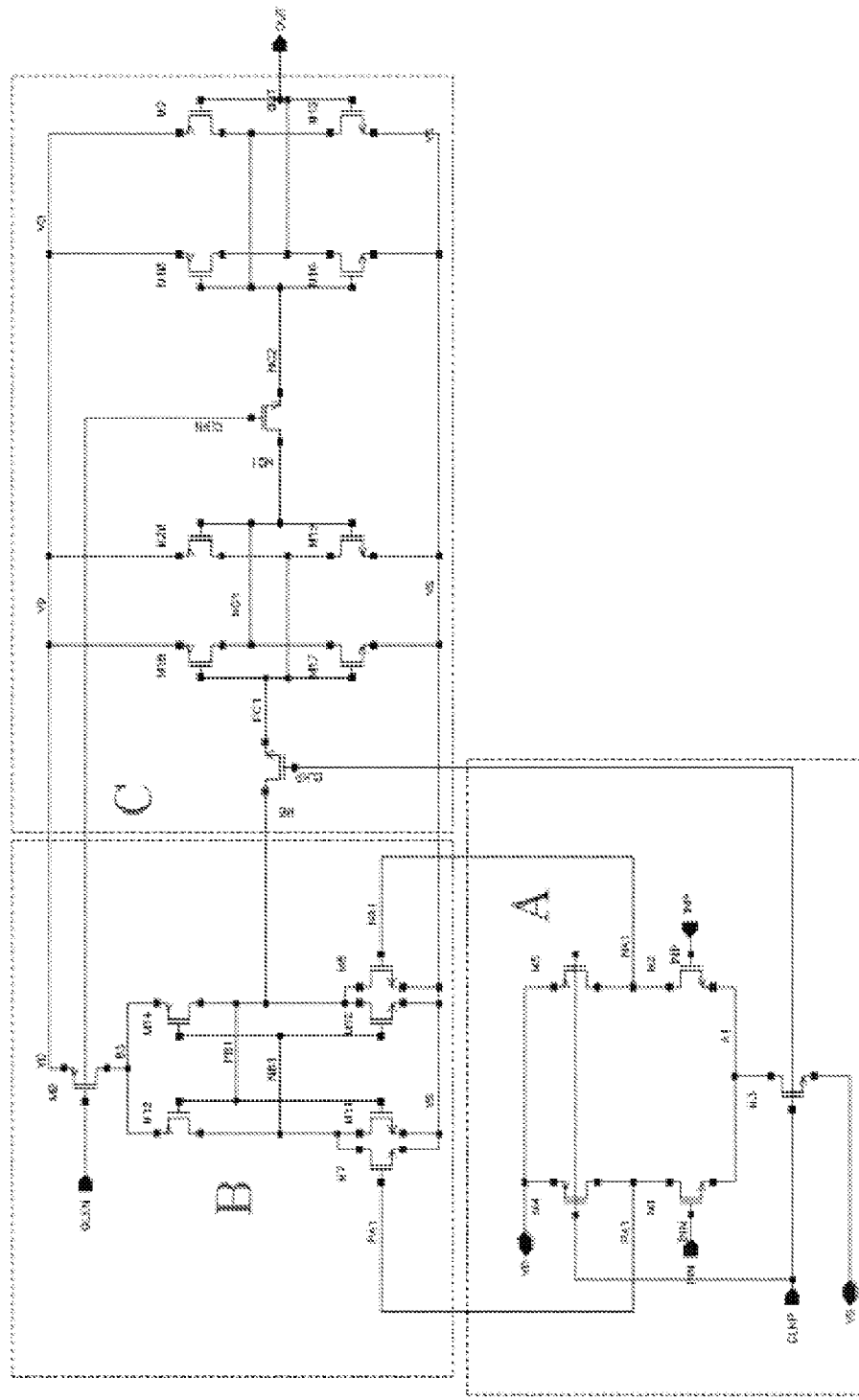
FIG. 2 is the circuit diagram of the high-speed dynamic comparative latch of the current technology.
Figure 3:
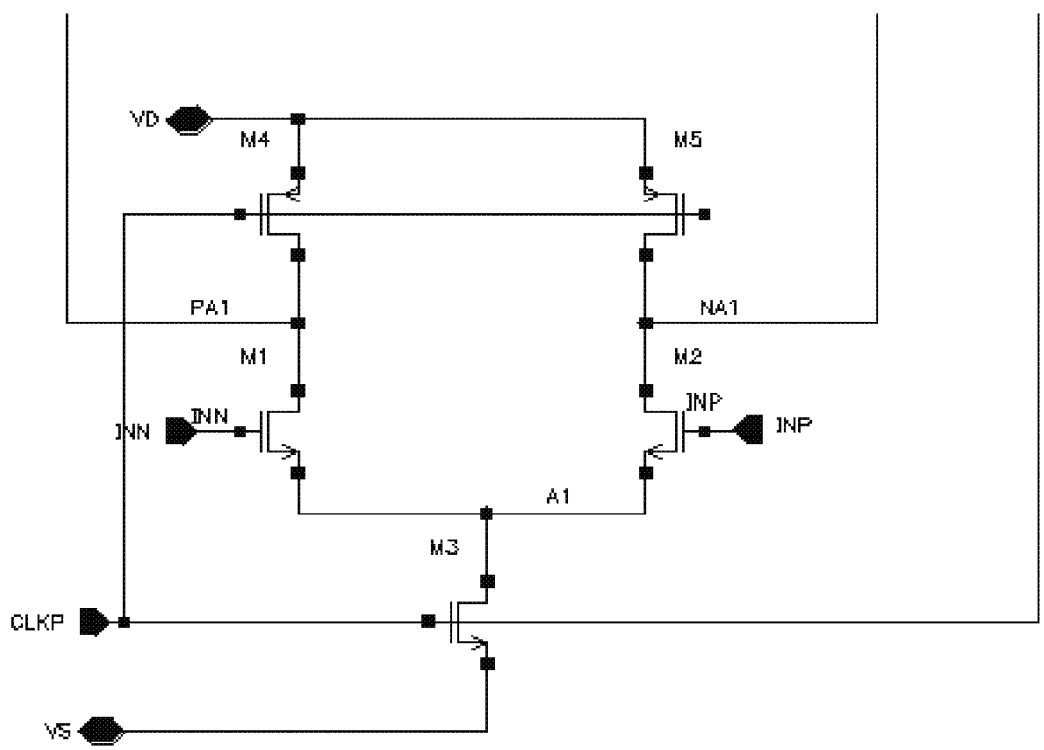
FIG. 3 is the enlarged diagram of A part of FIG. 2, showing the preamplifier unit.
Figure 4:
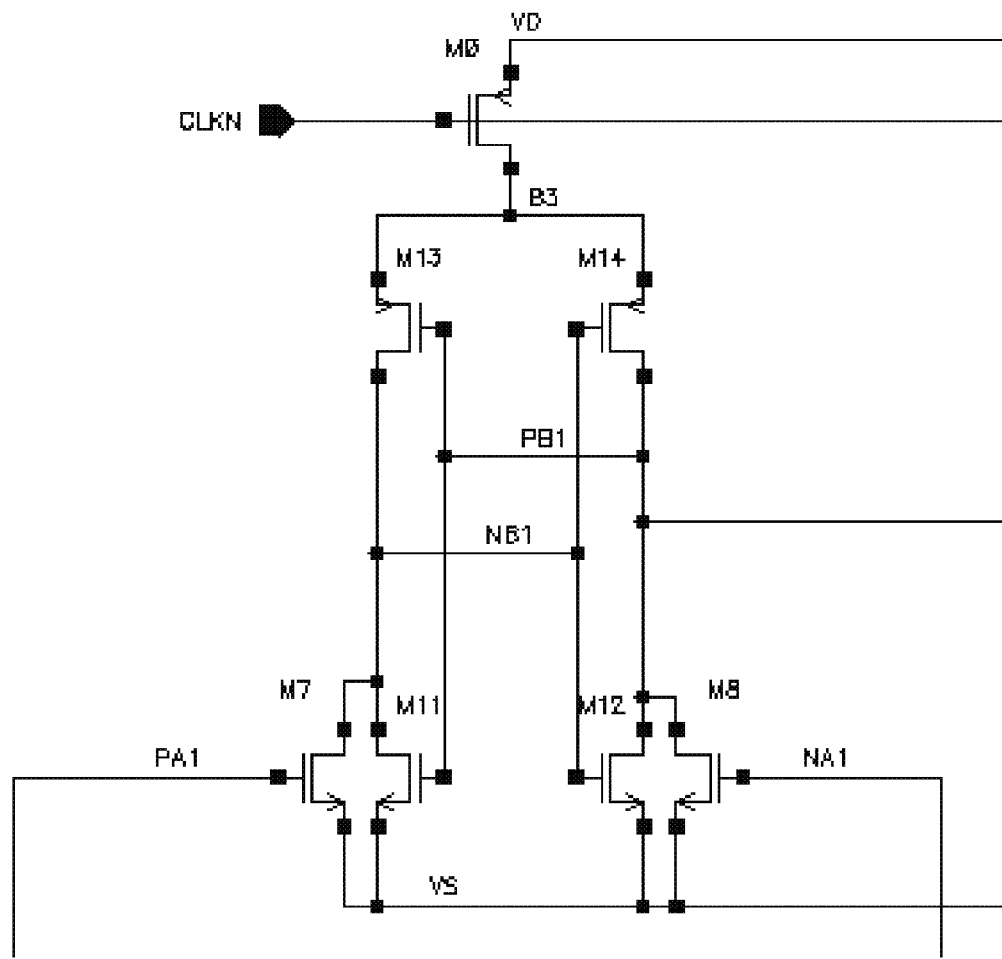
FIG. 4 is the enlarged diagram of B part of FIG. 2, showing the regenerating latch unit.
Figure 5:
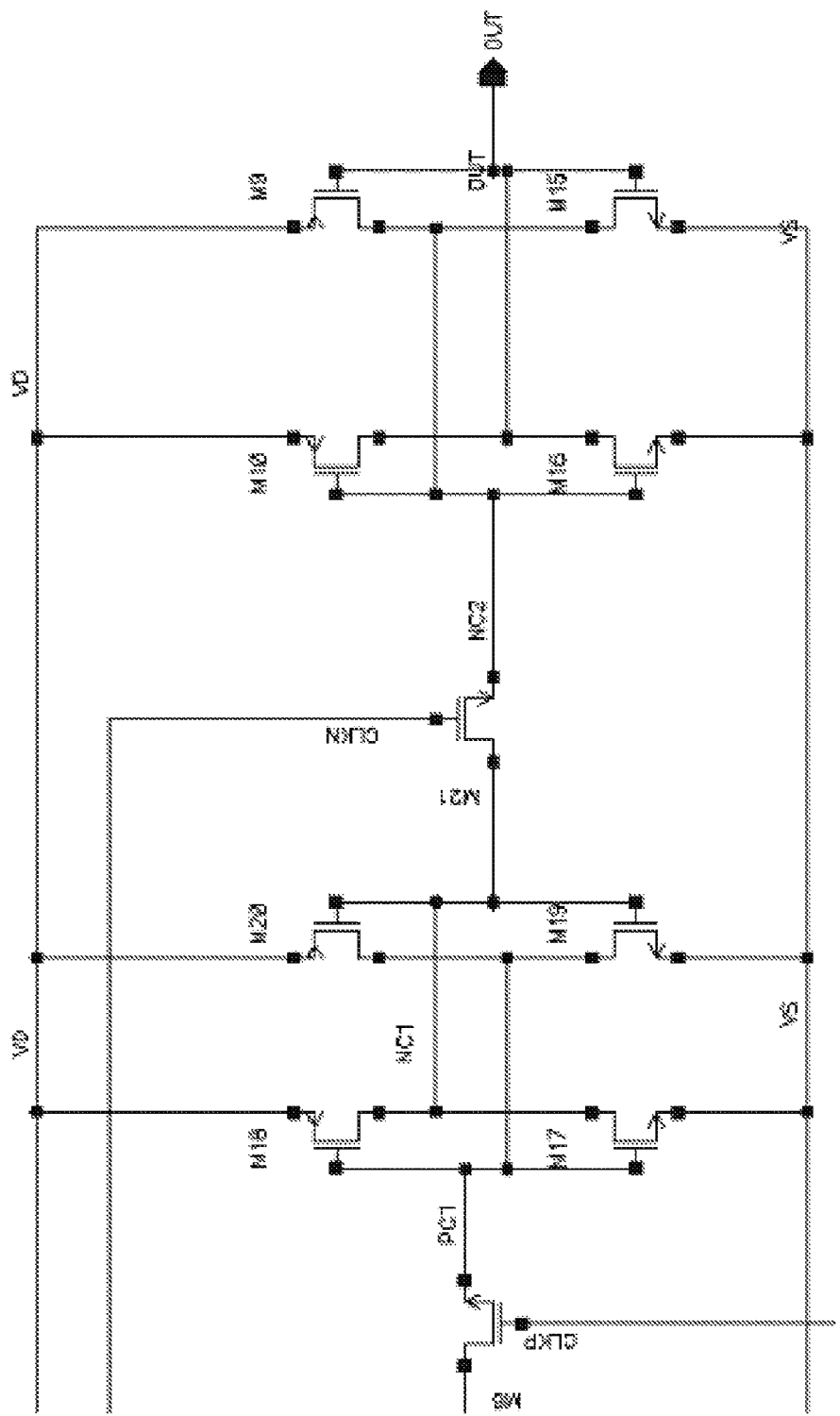
FIG. 5 is the enlarged diagram of C part of FIG. 2, showing the DFF unit.
Figure 6:
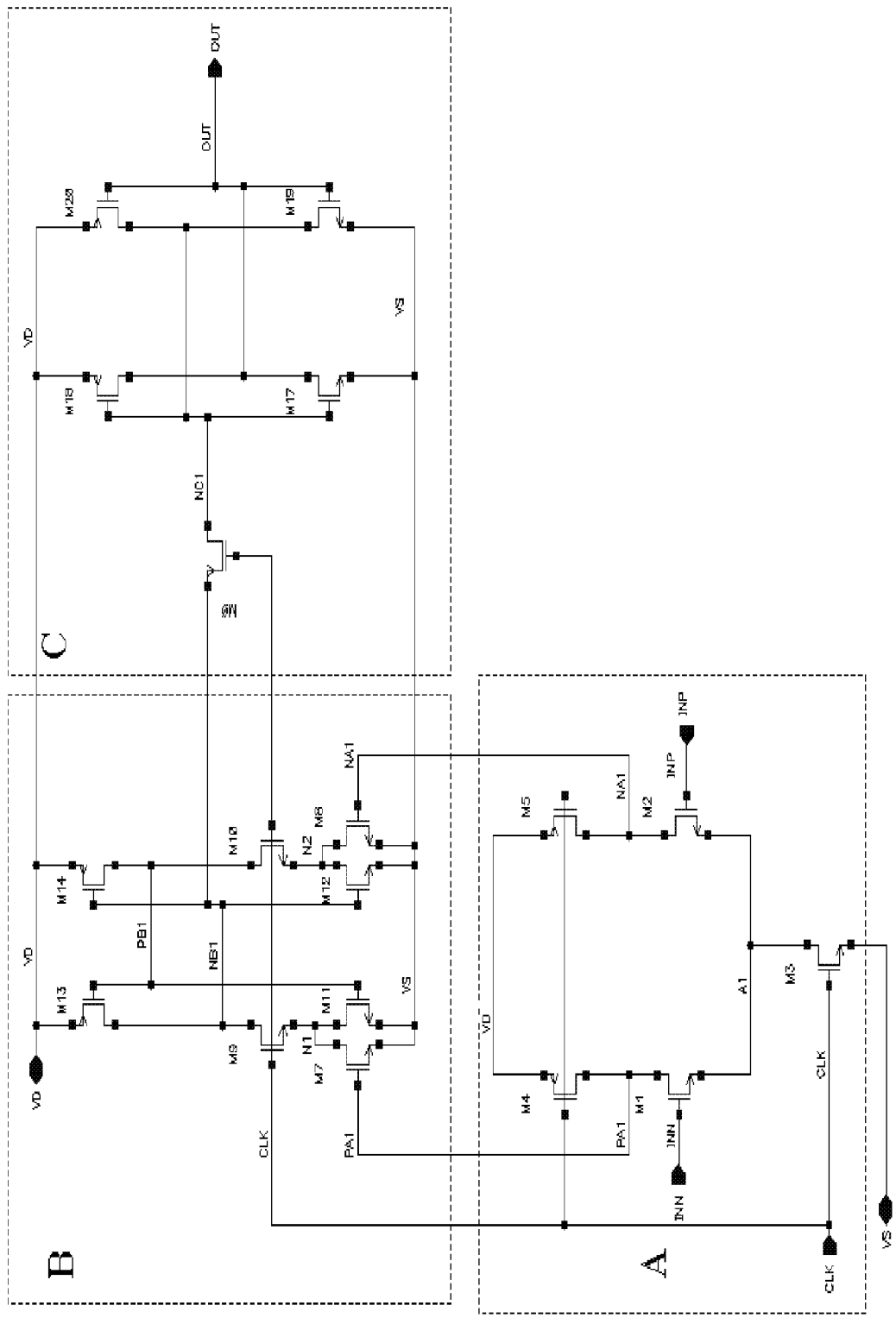
FIG. 6 is the circuit diagram of the preferred embodiment of the high-speed dynamic comparative latch of the present invention.
Figure 7:
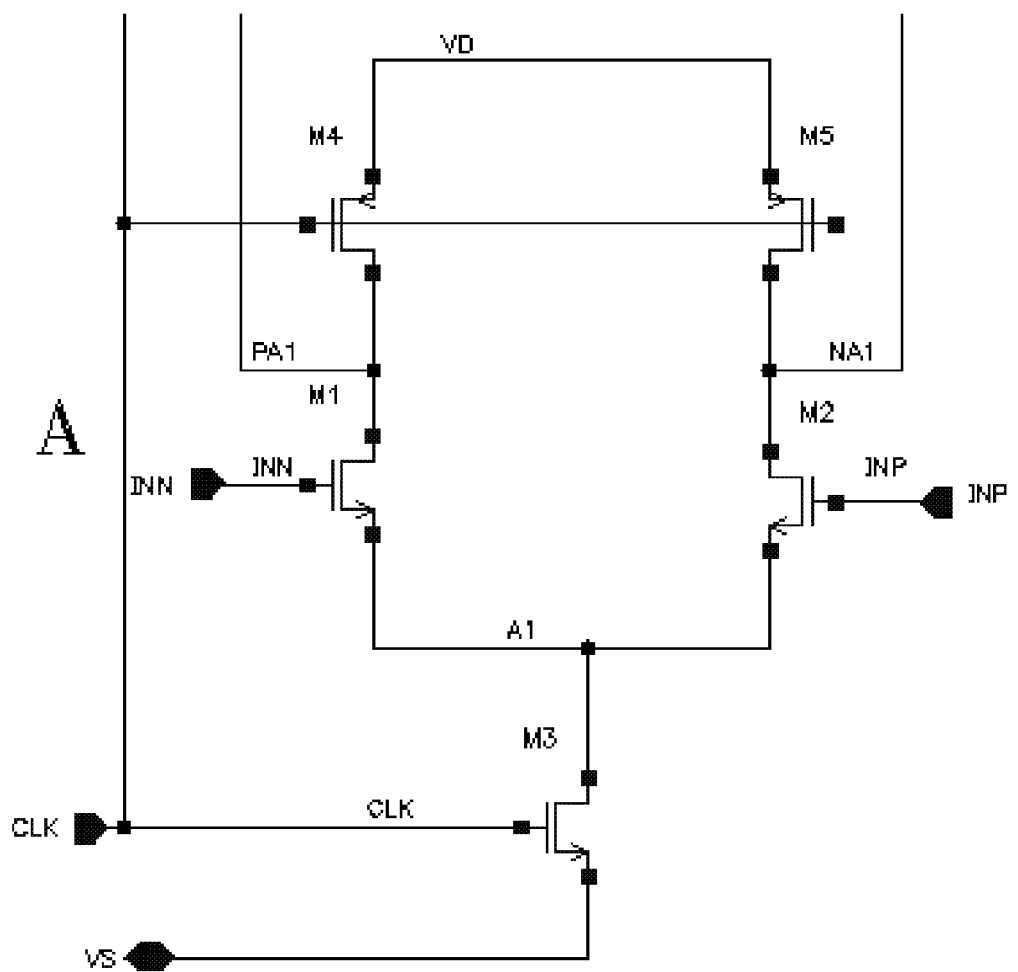
FIG. 7 is the enlarged diagram of A part of FIG. 7.
Figure 8:
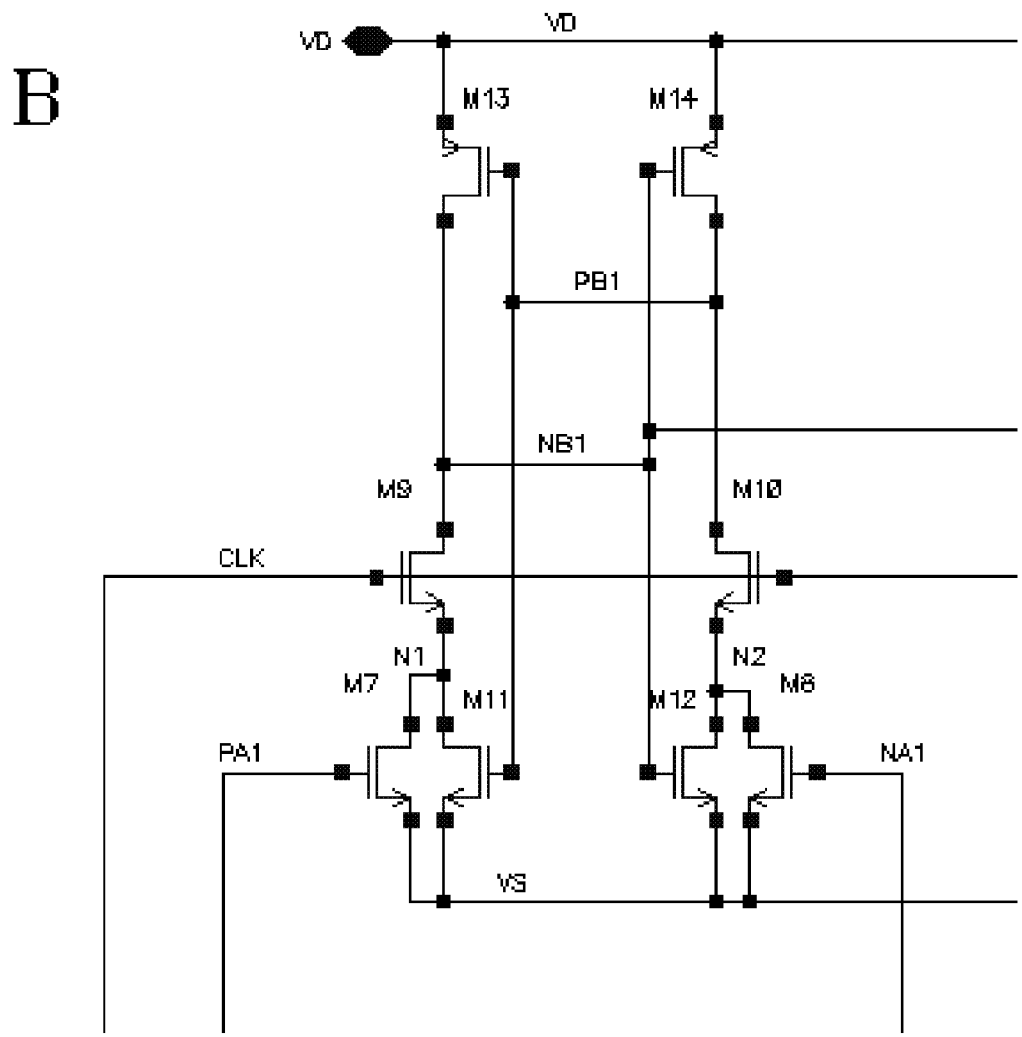
FIG. 8 is the enlarged diagram of B part of FIG. 7.
Figure 9:
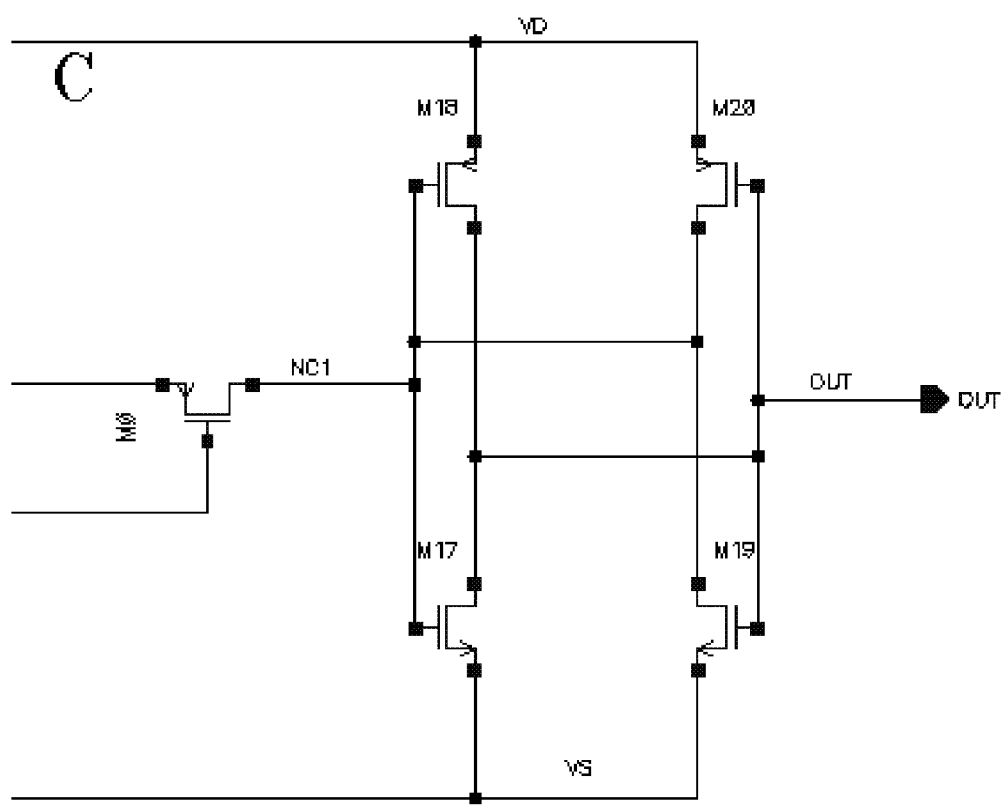
FIG. 9 is the enlarged diagram of C part of FIG. 7.

Referring to FIG. 4, INP and INN is a pair of differential signals. CLK is an input clock signal. OUT is the output of the high-speed comparative latch.

In the preferred embodiment of the present invention, the pre-amplifier unit A is consisting of a pair of input FET (Field Effect Transistor), M1 and M2, a pair of clock-controlled reset FET, M4 and M5, and a clock-controlled tail current FET M3, wherein the gate of the FET M1 is connected with the input signal INN, the drain is connected through a node PA1 to the drain of one clock-controlled reset FET M4, and the source is connected through a node A1 to the drain of the clock-controlled FET M3; the gate of the other FET M2 is connected with the input signal INP, the drain is connected in series through the node NA1 to the drain of the clock-controlled reset FET M5, and the source is connected through the node A1 to the drain of the clock-controlled FET M3; the gate of the clock-controlled FET M3 is connected to the clock signal CLKP, and the source is grounded; the gate of the pair of clock-controlled reset FET M4/M5 is connected to the clock signal CLK, and the source is connected to the power supply VD.

The regenerating latch unit B is consisting of a FET M7 controlled by the node PA1 of the pre-amplifier unit, a FET M8 controlled by the node NA1 of the pre-amplifier unit, a pair of FET M9 and M10 controlled by the input clock, and a group of FET M11/M12/M13/M14; the circuit structure is completely symmetrical circuit. The gate of the FET M7 is connected with the node PA1 of the pre-amplifier unit, the source is grounded, and the drain is connected—through a node N1 to the drain of the FET M11, and connected with the source of the clock-controlled FET M9; the source of M11 is grounded, the gate is connected through the node PB1 with the gate of M13, and connected with the drain of M14 and M14; the gate of the clock-controlled FET M9 is connected to the input clock CLK, the drain is connected through the node NB1 with the drain of M13, and connected with the gate of M14/M12; the source of M13 is connected to the power supply; the gate of M8 is connected with the node NA1 of the pre-amplifier unit A, the source is grounded, and the drain is connected through the node N2 with the drain of M12, and connected with the source of the clock-controlled FET M10; the source of the FET M12 is grounded, the gate is connected through the node NB1 with the gate of M14, and connected with the drain of M13 and M19; the gate of the clock-controlled FET M10 is connected to the clock CLK, the drain is connected through the node PB1 with the drain of M14, and connected with the gate of M13/M11; the source of M14 is connected to the supply power.

The latch unit C is consisting of a clock-controlled FET M0, an inverter consisting of FET M18 and M17, and another inverter consisting of FET M20 and M19; the clock-controlled FET M0 and the two inverters are connected with each other end to end. One terminal of the latch unit C is connected through the switch FET M0 controlled by the input clock signal CLK with the output OUTN of the regenerating latch unit B, and the other terminal is the final output OUT of the present high-speed dynamic latch.

The detailed working process is as follows:

When the clock CLK changes from a low level (CLK=0) to a high level (CLK=1), namely the clock is in its rising edge, the high-speed comparator changes from a reset mode to a working mode. The pre-amplifier unit A changes from a reset mode to a working mode; FET M4 and M5 are turned off and M3 is turned on. The FET M9 and M10 of the regenerating latch unit B controlled by the clock are turned on; then, the regenerating latch unit gets into a positive feedback latching mode from a reset mode, but with the nodes N1/N2 still being kept in a low state (N1=0/N2=0). The FET M0 in the latch unit C controlled by the clock CLK is turned off, and so the latch gets into a holding state.

When the clock CLK keeps in the stage of the high level (CLK=1), the high-speed comparator stays in a working mode. The differential mode of the inputted signals is enlarged through the pre-amplifier unit A. The FET M7 controlled by the node PA1 and M8 controlled by the node NA1 inject currents with unequal amounts to the regenerating latch unit B; the currents are determined on the enlarged differential mode. With the action of injected currents with different amounts, the regenerating latch unit B enlarges the errors of the injected currents through the positive feedback, and obtains corresponding outputs. Once the regenerating latch is established, the output of the regenerating latch circuit will keep in a latched state because of the positive feedback; at this time, even if the inputted signals flip, the output of the regenerating latch circuit will stay the same; namely, the output of the regenerating latch unit reflects the differential mode of the inputted signals of when the clock signal CLK is in the rising edge. The FET M0 in the latch unit C controlled by the clock CLK is turned off, and so the output of the latch still stays in a holding state, namely the immediately previous state.

When the clock CLK changes from the high level (CLK=1) to a low level (CLK=0) and keeps in the low level, the high-speed comparator changes from the working mode to a reset mode. The pre-amplifier unit A changes from the working mode to a reset mode; M3 is turned off; M4/M5 are turned on; the output nodes PA1/NA1 are reset to a high state (PA1/NA1=1). The regenerating latch unit B changes form the positive feedback latching mode to a reset mode; the FET M9/M10 controlled by the clock of the regenerating latch unit B are turned off; the outputs OUTP/OUTN are in a retaining state. Under the action of the FET M7 controlled by the node PA1, the node N1 is pulled down till lower than the reset state; under the action of M8 controlled by the node NA1, the node N2 is pulled down till lower than the reset state; the transistor M0 in the latch circuit controlled by the clock CLK is turned on, and then the latch unit C latches the output of the regenerating latch unit B and outputs it out.

Repeat the process described above, the high-speed dynamic comparative latch can continuously latches next inputted signals. To sum up, when the clock CLK is changing from a low level to a high level, the input signals are latched; when the clock CLK is a low level, the latched signals are output and kept for a clock cycle, so that the dynamic latching of the input signals under a high-speed clock is achieved.

The preferred embodiment of the present invention has the following advantages:
1) By re-designing the regenerating latch unit B, the present invention needs only one clock signal CLK;
2) In a clock cycle, at the first state, the regenerating latch unit B latches the outputted signals of the pre-amplifier unit A. Once the latch state is established, the latched result no longer reflects the variation of the differential signals. At the second state opposite to the first state, the output keeps an effective latched value; and in the meantime, the regenerating latch unit resets the relevant nodes in the circuit, which means that the outputted value of the regenerating latch unit is always effective. in a clock cycle.
3) The latch unit C latches the output of the regenerating latch unit B in the time of the low level of a clock cycle, and outputs it, while during the period of the high level it keeps the latched output as during the time of the low level. By that, it can be solved that the different establishing time of the latch of the regenerating latch unit and different outputted parasitical parameters due to the different technology and temperatures lead to the uncertainty of the delay time of its output relative to the rising edge of the clock, and accordingly compress the effective latched values, and finally give rise to the erroneous output of the latch unit.

One skilled in the art will understand that the embodiments of the present invention as shown in the drawings and described above is exemplary only and not intended to be limiting.

It will thus be seen that the objects of the present invention have been fully and effectively accomplished. Its embodiments have been shown and described for the purpose of illustrating the functional and structural principles of the present invention and is subject to change without departure from such principles. Therefore, this invention includes all modifications encompassed within the spirit and scope of the following claims.

What is claimed is:

1. A dynamic high-speed comparative latch, comprising:
   a pre-amplifier unit for enlarging input differential signals;
   a regenerating latch unit for latching outputted differential signals that come from the pre-amplifier unit by using a positive feedback, specifically, converting the output of the pre-amplifier unit into a latched result at a first state of a clock cycle, and then retaining the latched result and simultaneously resetting relevant nodes at a second state opposite to the first state of the clock cycle; and
   a latch unit for outputting the effective outputted value of the regenerating latch unit when the regenerating latch unit being in a retaining state,
   wherein the pre-amplifier unit, comprising only one input clock signal, is connected with the regenerating latch unit; and the regenerating latch unit is connected with the latch unit;
   wherein the regenerating latch unit consists of a FET M7 controlled by one output node PA1 of the pre-amplifier unit, a FET M8 controlled by one output node NA1 of the pre-amplifier unit, a pair of clock-controlled FET M9 and M10, and a group of FET M11, M12, M13 and M14;
   the circuit structure is completely symmetrical.

2. The dynamic high-speed comparative latch recited in claim 1, wherein the gate of the FET M7 is connected with the node PA1 of the pre-amplifier unit, the source is grounded, and the drain is connected through a node N1 with the drain of the FET M11, and connected with the source of the clock-controlled FET M9;
   the source of M11 is grounded, the gate is connected through the node PB1 with the gate of M13, and connected with the drain of M14 and M14;
   the gate of the clock-controlled FET M9 is connected to the input clock CLK, the drain is connected through the node NB1 with the drain of M13, and connected with the gate of M14 and M12;
   the source of M13 is connected to the power supply;
   the gate of M8 is connected with the node NA1 of the pre-amplifier unit, the source is grounded, and the drain is connected through a node N2 with the drain of M12, and connected with the source of the clock-controlled FET M10;
   the source of the FET M12 is grounded, the gate is connected through the node NB1 with the gate of M14, and connected with the drain of M13 and M19;
   the gate of the clock-controlled FET M10 is connected to the clock signal CLK, the drain is connected through the node PB1 with the drain of M14, and connected with the gate of M13 and M11;
   the source of M14 is connected to the supply power.

3. A dynamic high-speed comparative latch, comprising:
   a pre-amplifier unit for enlarging input differential signals;

a regenerating latch unit for latching outputted differential signals that come from the pre-amplifier unit by using a positive feedback, specifically, converting the output of the pre-amplifier unit into a latched result at a first state of a clock cycle, and then retaining the latched result and simultaneously resetting relevant nodes at a second state opposite to the first state of the clock cycle; and a latch unit for outputting the effective outputted value of the regenerating latch unit when the regenerating latch unit being in a retaining state, wherein the pre-amplifier unit, comprising only one input clock signal, is connected with the regenerating latch unit; and the regenerating latch unit is connected with the latch unit;

wherein the latch unit consists of a clock-controlled FET M0, an inverter consisting of FET M18 and M17, and the other inverter consisting of FET M20 and M19; the clock-controlled FET M0 and the two inverters are connected with each other end to end.

4. The dynamic high-speed comparative latch recited in claim 3, wherein one terminal of the latch unit is connected through the switch FET M0 controlled by the input clock CLK with the output OUTN of the regenerating latch unit, and the other terminal is the final output OUT of the high-speed dynamic comparative latch.

* * * * *